United States Patent
Chen et al.

(10) Patent No.: US 7,701,050 B2
(45) Date of Patent: Apr. 20, 2010

(54) SIDE-VIEW OPTICAL DIODE PACKAGE AND FABRICATING PROCESS THEREOF

(75) Inventors: Chih-Ming Chen, Taoyuan (TW); Deng-Huei Hwang, Taipei (TW); Ching-Chi Cheng, Hsinchu (TW); An-Nong Wen, Hsinchu (TW)

(73) Assignee: Silicon Base Development Inc., Hsinchu (TW)

( * ) Notice: Subject to any disclaimer, the term of this patent is extended or adjusted under 35 U.S.C. 154(b) by 228 days.

(21) Appl. No.: 11/954,679

(22) Filed: Dec. 12, 2007

(65) Prior Publication Data

US 2008/0142832 A1 Jun. 19, 2008

(30) Foreign Application Priority Data

Dec. 13, 2006 (TW) .............................. 95146743 A
May 23, 2007 (TW) .............................. 96118448 A

(51) Int. Cl.
*H01L 23/48* (2006.01)
*H01L 29/267* (2006.01)
*H01L 29/22* (2006.01)
*H01L 31/0232* (2006.01)
*H01L 31/0203* (2006.01)

(52) U.S. Cl. .......................... 257/693; 257/81; 257/99; 257/433; 257/434; 257/432

(58) Field of Classification Search ................. 257/693, 257/81, 99, 432, 433, 434
See application file for complete search history.

(56) References Cited

U.S. PATENT DOCUMENTS

| D511,148 S | * | 11/2005 | Ishida | ........................ D13/180 |
| D529,877 S | * | 10/2006 | Inoue | ........................ D13/180 |
| 7,378,728 B2 | * | 5/2008 | Ito et al. | ...................... 257/693 |
| 7,393,122 B2 | * | 7/2008 | Tsuzuki et al. | .............. 362/304 |
| 2005/0205974 A1 | * | 9/2005 | Su et al. | ...................... 257/678 |
| 2006/0023451 A1 | * | 2/2006 | Han et al. | .................... 362/249 |

* cited by examiner

*Primary Examiner*—Luan C Thai
(74) *Attorney, Agent, or Firm*—Kirton & McConkie; Evan R. Witt

(57) ABSTRACT

A side-view optical diode package is mounted on a printed circuit board with at least a solder bump. The side-view optical diode package includes a silicon substrate, a holding space, a bonding surface and a positioning structure. The silicon substrate has a first surface and a second surface. The holding space has a top opening in the first surface and a bottom for holding an optical diode thereon. The bonding surface is disposed at a lateral side of the silicon substrate and bonded onto the printed circuit board. The positioning structure has at least a solder-receiving portion beside the bonding surface and corresponding to the solder bump. The solder bump is molten during a soldering process and received in the solder-receiving portion, thereby facilitating positioning the silicon substrate on the printed circuit board.

10 Claims, 14 Drawing Sheets

SIDE-VIEW OPTICAL DIODE PACKAGE AND FABRICATING PROCESS THEREOF

FIELD OF THE INVENTION

The present invention relates to a side-view optical diode package, and more particularly to a side-view optical diode package to be mounted on a printed circuit board. The present invention also relates to a process of fabricating such side-view optical diode package.

BACKGROUND OF THE INVENTION

Typically, two approaches are employed to mount a side-view optical diode package. The first approach involves the use of a printed circuit board (PCB) made of a composite material as a substrate. The side-view optical diode package is mounted on the printed circuit board and then encapsulated by a plastic molding operation. The second approach involves the use of a metallic lead frame as the substrate. The side-view optical diode package is mounted on the metallic frame and then encapsulated by an ejection molding operation or a plastic molding operation.

These two approaches, however, have some drawbacks. For example, the side-view optical diode package has poor temperature resistance and low heat-dissipating efficiency. In addition, during the side-view optical diode package is soldered onto the printed circuit board, some of the solder may overflow from the rear side of the silicon substrate to the lateral side and thus cause an leakage current. Due to the overflowing solder, the side-view optical diode package may fail to be securely attached onto the printed circuit board.

Therefore, there is a need of providing an improved side-view optical diode package so as to obviate the drawbacks encountered from the prior art.

SUMMARY OF THE INVENTION

The present invention provides a side-view optical diode package, in which the side-view optical diode package has a positioning structure for preventing the solder from overflowing and facilitating securely fixing the side-view optical diode package on the printed circuit board.

The present invention also provides a fabricating process of such a side-view optical diode package.

In accordance with a first aspect of the present invention, there is provided a side-view optical diode package. The side-view optical diode package is mounted on a printed circuit board with at least a solder bump. The side-view optical diode package includes a silicon substrate, a holding space, a bonding surface and a positioning structure. The silicon substrate has a first surface and a second surface. The holding space having a top opening in the first surface and a bottom for holding an optical diode thereon. The bonding surface is disposed at a lateral side of the silicon substrate and bonded onto the printed circuit board. The positioning structure has at least a solder-receiving portion beside the bonding surface and corresponding to the solder bump. The solder bump is molten during a soldering process and received in the solder-receiving portion, thereby facilitating positioning the silicon substrate on the printed circuit board.

In an embodiment, the at least a solder-receiving portion includes a first indentation and a second indentation. The first indentation is disposed at the junction between a first sidewall of the silicon substrate, the first surface of the silicon substrate and the bonding surface. The second indentation disposed at the junction between a second sidewall of the silicon substrate, the first surface of the silicon substrate and the bonding surface.

In an embodiment, the at least a solder-receiving portion further includes a third indentation and a fourth indentation. The third indentation is disposed at the junction between the first sidewall of the silicon substrate, the second surface of the silicon substrate and the bonding surface. The fourth indentation is disposed at the junction between the second sidewall of the silicon substrate, the second surface of the silicon substrate and the bonding surface.

In an embodiment, the at least a solder-receiving portion includes a first concave region and a second concave region. The first concave region is disposed at the junction between a first sidewall of the silicon substrate, the first surface of the silicon substrate and the bonding surface. The second concave region is disposed at the junction between a second sidewall of the silicon substrate, the first surface of the silicon substrate and the bonding surface.

In an embodiment, the depth of the holding space is greater than the thickness of the optical diode and the top opening of the holding space is hexagonal or octagonal.

In an embodiment, the side-view optical diode package further includes a conductive structure, which is partially formed on the bottom of the holding space, the first surface of the silicon substrate and the surface of the positioning structure.

In an embodiment, the solder-receiving portion of the positioning structure further has an inclined sidewall.

In an embodiment, the silicon substrate is a high resistivity silicon substrate with (100)-oriented lattice, and the inclined sidewall has a more than 80-degree (100) equivalent crystallographic surface. The holding space includes a first slant with a 54.74-degree (111) equivalent crystallographic surface and a second slant with a more than 80-degree (100) equivalent crystallographic surface.

In an embodiment, the silicon substrate is a high resistivity silicon substrate with (110)-oriented lattice, and the inclined sidewall has a more than 80-degree (111) equivalent crystallographic surface. The holding space includes a first slant with a 35.3-degree (111) equivalent crystallographic surface and a second slant with a more than 80-degree (111) equivalent crystallographic surface.

Preferably, the side-view optical diode package is a single side-view optical diode package or a double side-view optical diode package.

In accordance with a second aspect of the present invention, there is provided a process of fabricating a side-view optical diode package. First of all, a silicon substrate having a first surface and a second surface is provided. Then, a first mask is formed on the first surface of the silicon substrate. Then, a first opening and a second opening is defined in the first surface of the silicon substrate. Afterwards, the silicon substrate is etched through the first opening and the second opening, and the first mask layer is removed, thereby respectively forming a holding space and a first positioning structure.

In an embodiment, the process further comprising a step of partially forming a conducting structure formed on the bottom of the holding space, the first surface of the silicon substrate and the surface of the first positioning structure.

In an embodiment, the process further comprising steps of forming a second mask on the second surface of the silicon substrate, defining a third opening in the second surface of the silicon substrate, and etching the silicon substrate through the third opening and then removing the second mask layer, thereby forming a second positioning structure.

In an embodiment, the etching step is a wet etching procedure carried out in potassium hydroxide (KOH) or tetramethyl ammonium hydroxide (TMAH).

In an embodiment, the etching step is a dry etching procedure by using sulfur hexafluoride (SF6) or carbon tetrafluoride (CF4) etching gas.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed. The schematic drawings, not to scale, are employed to illustrate the specific features of the present invention.

Figure 1A:
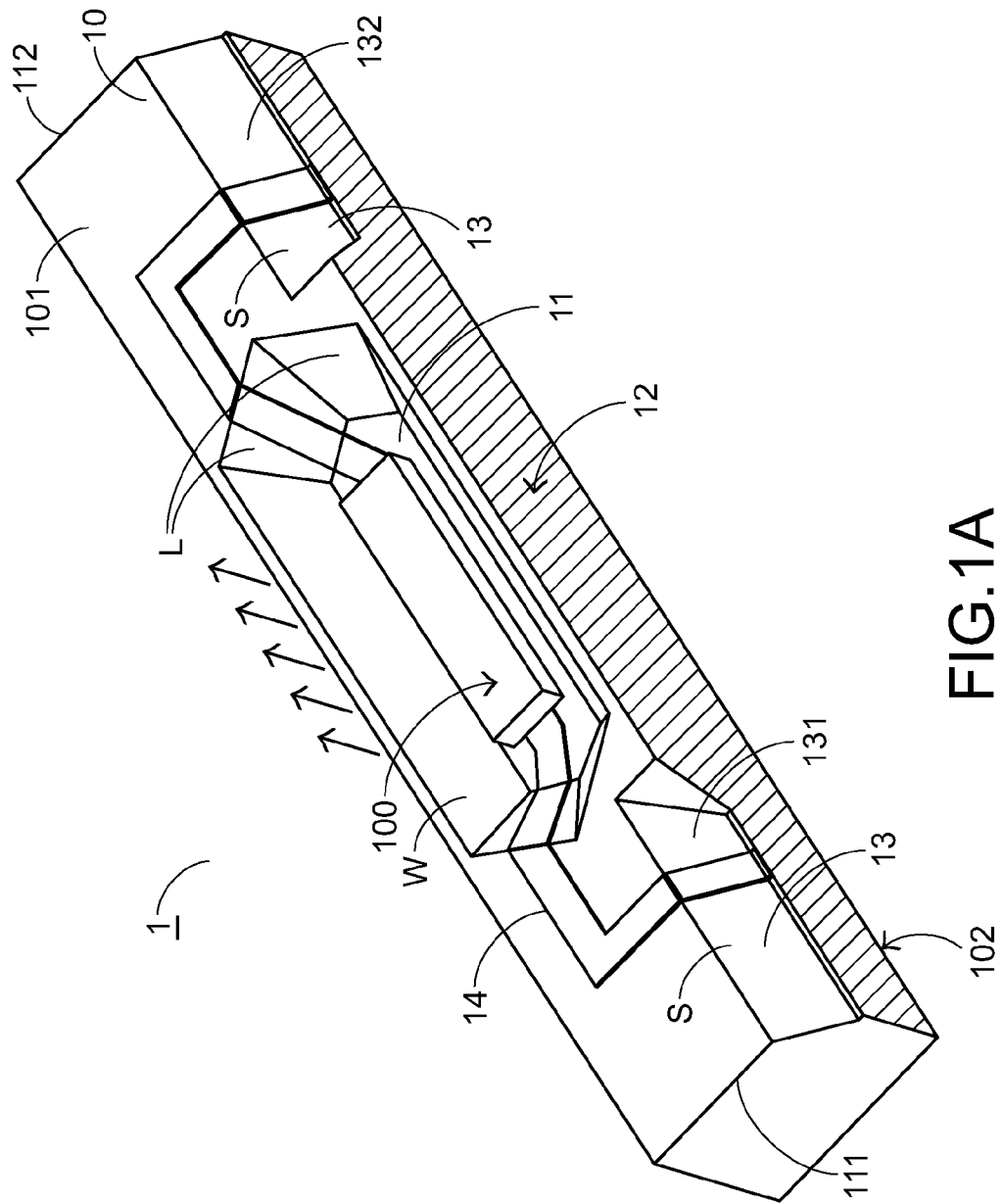
FIG. 1A is a schematic perspective view of a side-view optical diode package according to a first preferred embodiment of the present invention is illustrated.
Figure 1B:
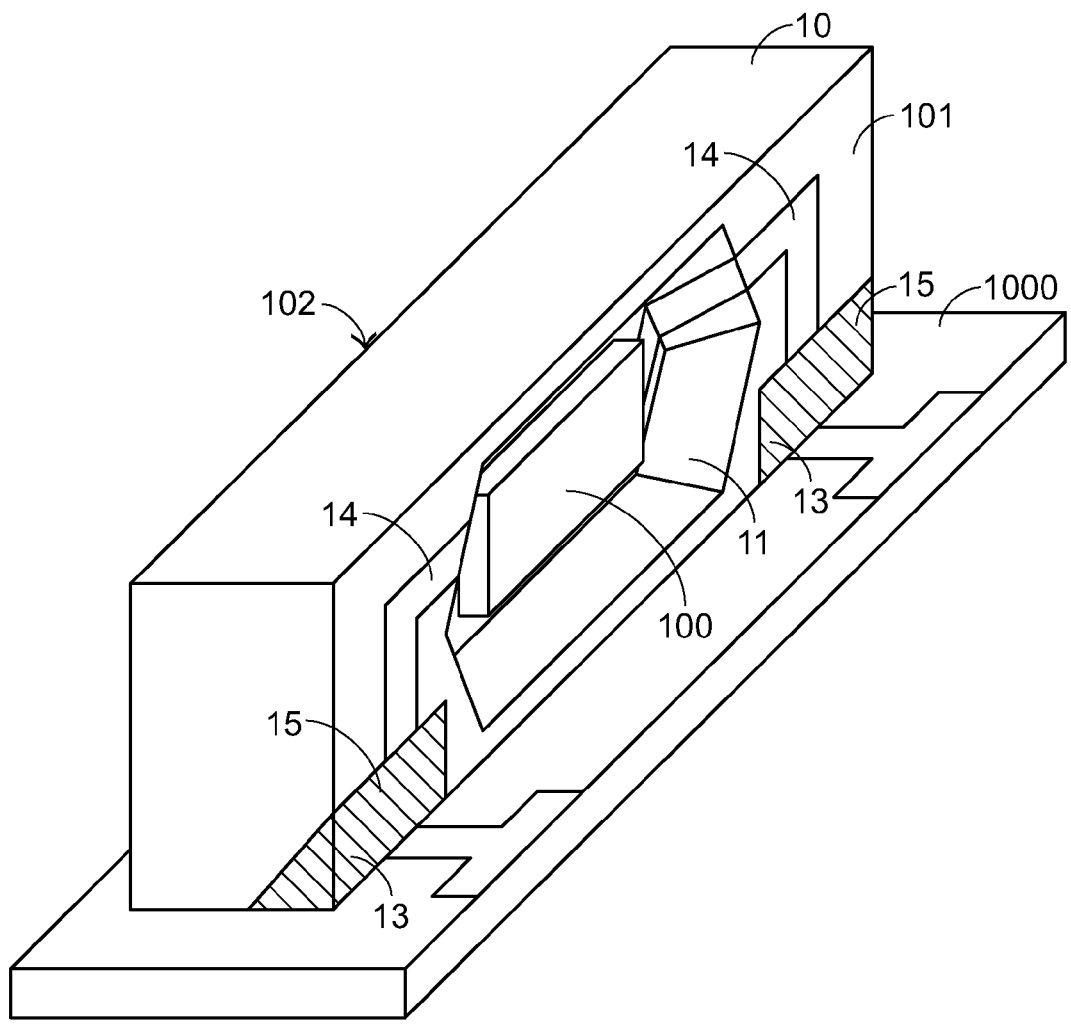
FIG. 1B schematically illustrates the side-view optical diode package of FIG. 1A fixed on a printed circuit board.

FIG. 1A is a schematic perspective view of a side-view optical diode package 1 according to a first preferred embodiment of the present invention is illustrated. In FIG. 1B, the side-view optical diode package 1 is fixed on a printed circuit board 1000. Please refer to FIGS. 1A and 1B. The side-view optical diode package 1 principally includes a silicon substrate 10, a holding space 11, a bonding surface 12, a positioning structure 13 and a conducting structure 14.

The silicon substrate 10 has a first surface 101 and a second surface 102. The silicon substrate 10 is a high resistivity silicon substrate.

The top opening of the holding space 11 is arranged in the same level of the first surface 101 of the silicon substrate 10. In this embodiment, the top opening of the holding space 11 is hexagonal. Alternative, the top opening of the holding space 11 is octagonal. The bottom of the holding space 11 is used for supporting an optical diode 100 such as an optical diode (LED). The depth of the holding space 11 is greater than the thickness of the optical diode 100. The optical diode 100 is supported in the holding space 11 by a die bonding and wire bonding process or a flip chip process. The sidewalls of the holding space 11 have slants L and W, which may facilitate increasing the intensity of the light beam (in the direction indicated by the arrow) emitted from the optical diode 100. In a case that the silicon substrate 10 is a high resistivity silicon substrate with (100)-oriented lattice, the inclined angle between the bottom and the slant L is 54.74 degrees and the slant L is a (111) equivalent crystallographic surface. In addition, the inclined angle between the bottom and the slant W is greater than 80 degrees and the slant W is a (100) equivalent crystallographic surface. In another case that the silicon substrate 10 is a high resistivity silicon substrate with (110)-oriented lattice, the slant L is a 35.3-degree (111) equivalent crystallographic surface, and the slant W is a more than 80-degree (111) equivalent crystallographic surface.

The bonding surface 12 is disposed at a lateral side of the silicon substrate 10 and bonded to the printed circuit board 1000.

In accordance to a key feature of the present invention, the positioning structure 13 is formed on the silicon substrate 10 and includes a first indentation 131 and a second indentation 132. The first indentation 131 is disposed at the junction between a first sidewall 111 of the silicon substrate 10, the first surface 101 of the silicon substrate 10 and the bonding surface 12. Similarly, the second indentation 132 is disposed at the junction between a second sidewall 112 of the silicon substrate 10, the first surface 101 of the silicon substrate 10 and the bonding surface 12. Moreover, the positioning structure 13 has an inclined sidewall S. In a case that the silicon substrate 10 has (100)-oriented lattice, the inclined sidewall S is a more than 80-degree (100) equivalent crystallographic surface. In another case that the silicon substrate 10 is a high resistivity silicon substrate with (110)-oriented lattice, the inclined sidewall S is a more than 80-degree (111) equivalent crystallographic surface.

The conducting structure 14 is partially formed on the bottom of the holding space 11, the first surface 101 of the silicon substrate 10 and the surface of the positioning structure 13. The conducting structure 14 is electrically connected to the optical diode 100.

Furthermore, the printed circuit board 1000 has solder bumps 15 corresponding to the first indentation 131 and the second indentation 132 of the positioning structure 13. During the silicon substrate 10 is soldered on the printed circuit board 1000, the solder bumps 15 are molten and filled in the indentations 131 and 132. The indentations 131 and 132 may prevent the molten solder bumps 15 from overflowing from the periphery of the package. After the molten solder bumps 15 are cooled and solidified, the silicon substrate 10 is bonded onto the printed circuit board 1000 via the solder bumps 15.

It is noted that, however, those skilled in the art will readily observe that numerous modifications and alterations may be made while retaining the teachings of the invention. For example, the holding space 11 is dispensed with and thus the optical diode 100 is directly mounted on the first surface 101 of the silicon substrate 10. In addition, electrical traces are arranged on the silicon substrate 10 for transferring electricity or signals from the printed circuit board 1000 to the wiring pads of the optical diode 100. Moreover, after the die bonding or wire boning process, the optical diode 100 is encapsulated with a protective optical adhesive.

Hereinafter, a process of fabricating the side-view optical diode package of the first preferred embodiment will be illustrated as follows with reference to FIGS. 2A, 2B, 2C, 2D and 2E.

Figure 2A:
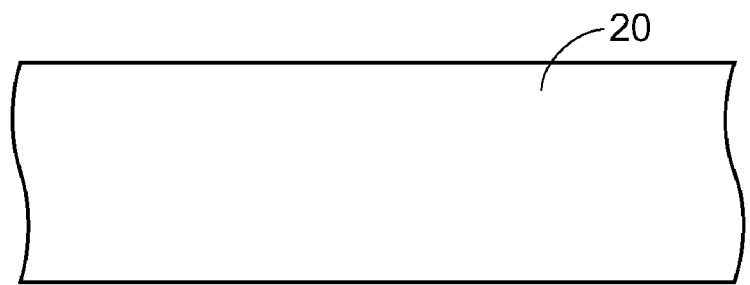
FIGS. 2A, 2B, 2C, 2D and 2E are schematic cross-sectional views illustrating the steps of a process for fabricating the side-view optical diode package of the first preferred embodiment.
Figure 2B:
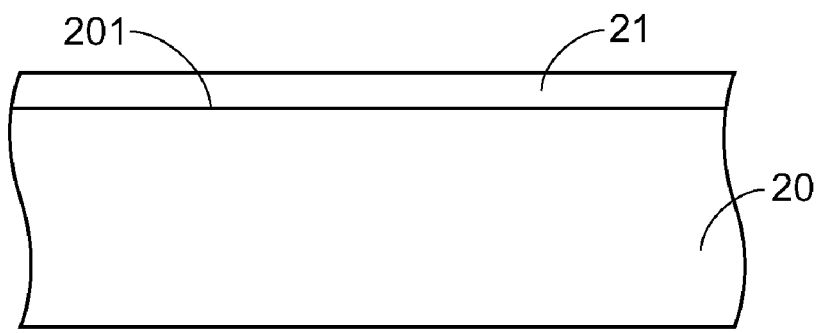
Figure 2C:
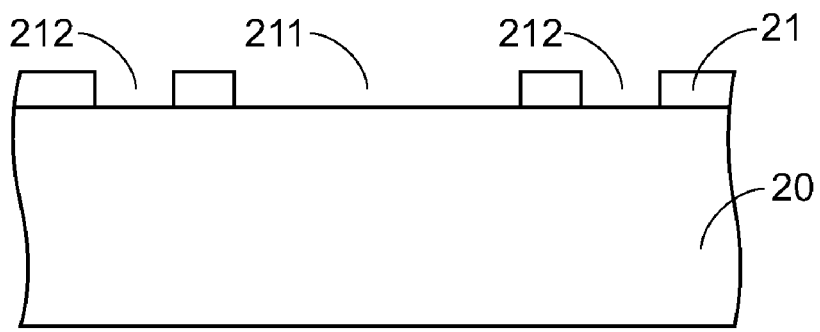
Figure 2D:
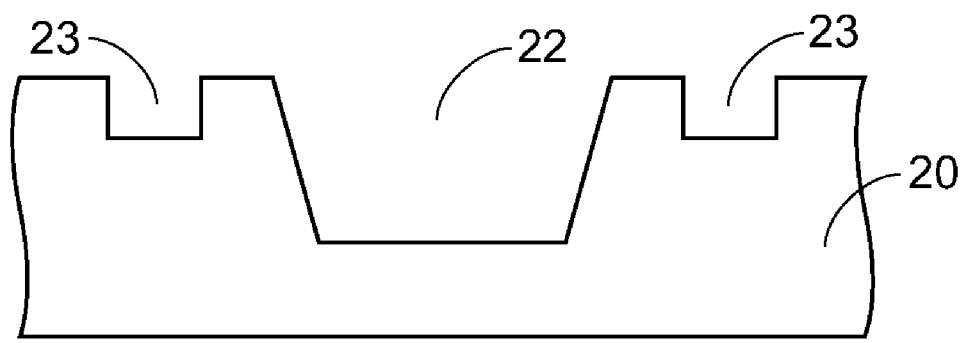
Figure 2E:
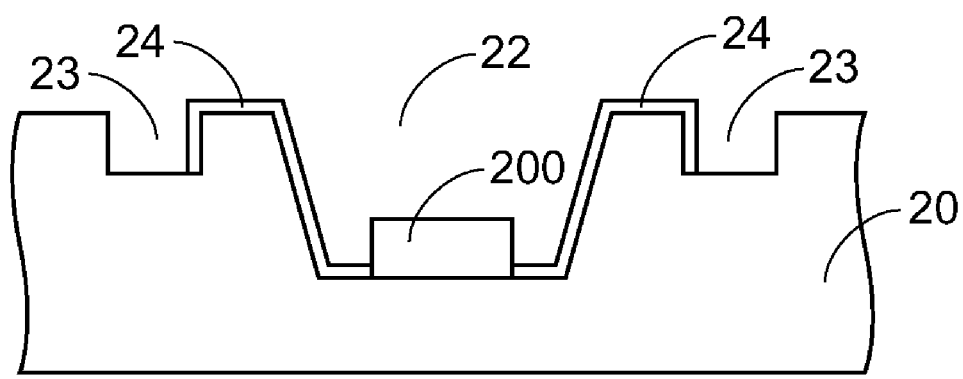
Figure 2F:
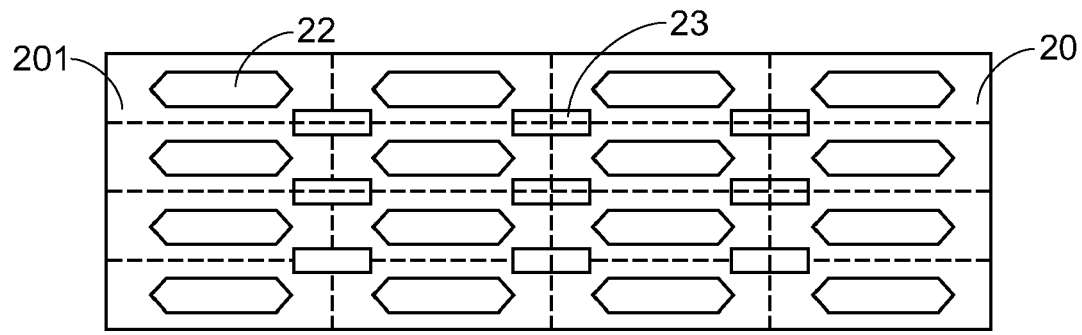
FIGS. 2F and 2I are respectively schematic top and side views illustrating multiple side-view optical diode packages before dicing-cut in a first example.

First of all, as shown in FIG. 2A, a silicon substrate 20 is provided. Then, as shown in FIG. 2B, a mask layer 21, which can be made of silicon nitride, is formed on a first surface 201 of the silicon substrate 20. Then, as shown in FIG. 2C, the mask layer 21 is patterned by a photolithography and etching procedure to define a first opening 211 and a second opening 212. Next, as shown in FIG. 2D, an etching procedure is performed to partially etch off the silicon substrate 20 in the first opening 211 and the second opening 212 and then the mask layer 21 is moved, thereby defining a holding space 22 and a positioning structure 23, respectively. The etching procedure is a wet etching procedure or a reactive ion procedure. For executing the wet etching procedure, potassium hydroxide (KOH) or tetramethyl ammonium hydroxide (TMAH) solution is used. The dry-etching procedure is performed by using sulfur hexafluoride (SF6) or carbon tetrafluoride (CF4) etching gas. Then, as shown in FIG. 2E, a conducting material is partially deposited on the first surface 201 of the silicon substrate 20, the bottom surface of the holding space 21 and a surface of the positioning structure 23, thereby forming a conducting structure 24. Then, an optical diode 200 is mounted on the conducting structure 24 within the holding space 22. After the resulting structure of FIG. 2F is dicing-cut along the dashed lines, multiple side-view optical diode packages are formed. It is noted that the sequences of mounting the optical diode 200 and cutting the silicon substrate 20 are exchangeable. That is, the optical diode 200 may be mounted on the conducting structure 24 within the holding space 22 after a resulting package base is cut from the silicon substrate 20. FIG. 2I is a side view of the side-view optical diode package obtained from the resulting structure of FIG. 2F. In this embodiment, the top opening of the positioning structure 23 as shown in FIG. 2F is substantially a rectangle.

Figure 2G:
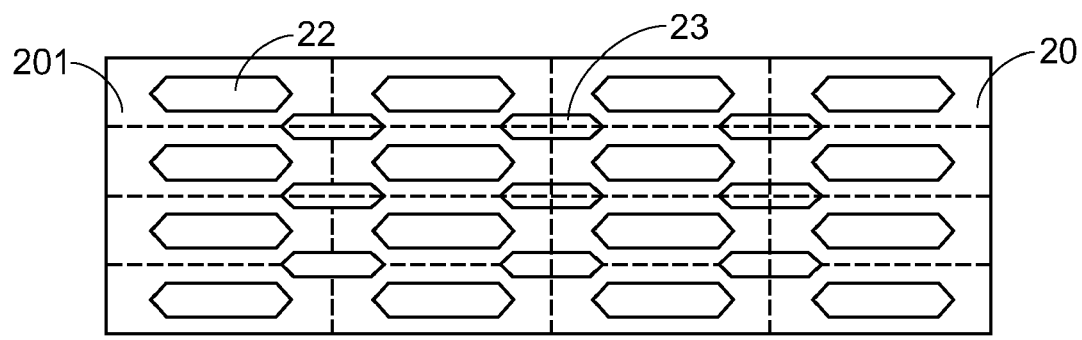
FIGS. 2G and 2J are respectively schematic top and side views illustrating multiple side-view optical diode packages before dicing-cut in a second example.
Figure 2H:
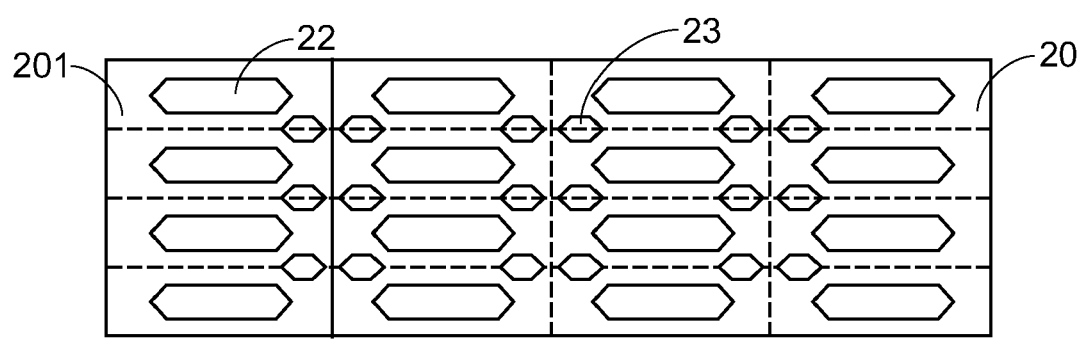
FIGS. 2H and 2K are respectively schematic top and side views illustrating multiple side-view optical diode packages before dicing-cut in a third example.
Figure 2I:
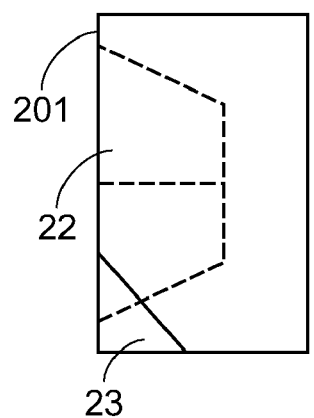
Figure 2J:
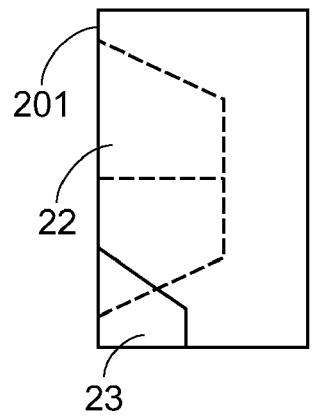
Figure 2K:
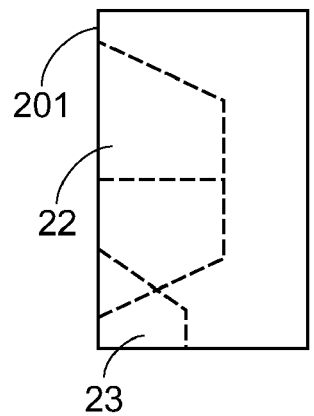

FIG. 2G is a variation of the resulting structure of FIG. 2F. FIG. 2J is a side view of a side-view optical diode package obtained from the resulting structure of FIG. 2G. In this embodiment, the top opening of the positioning structure 23 as shown in FIG. 2G is substantially a hexagon. FIG. 2H is another variation of the resulting structure of FIG. 2F. FIG. 2K is a side view of a side-view optical diode package obtained from the resulting structure of FIG. 2H. In this embodiment, the top opening of the positioning structure 23 as shown in FIG. 2H is substantially a pair of hexagons.

Figure 3A:
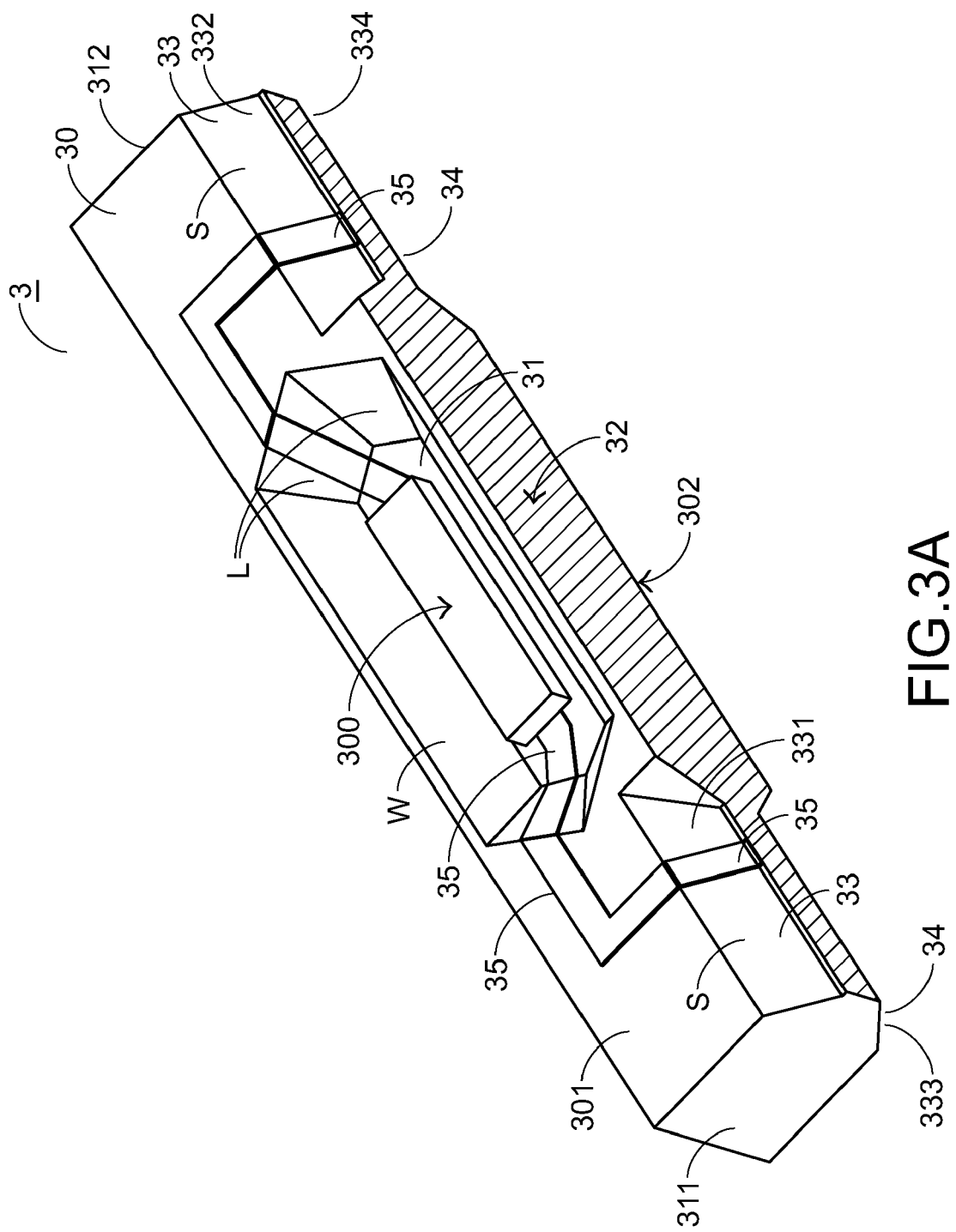
FIG. 3A is a schematic perspective view of a side-view optical diode package according to a second preferred embodiment of the present invention is illustrated.
Figure 3B:
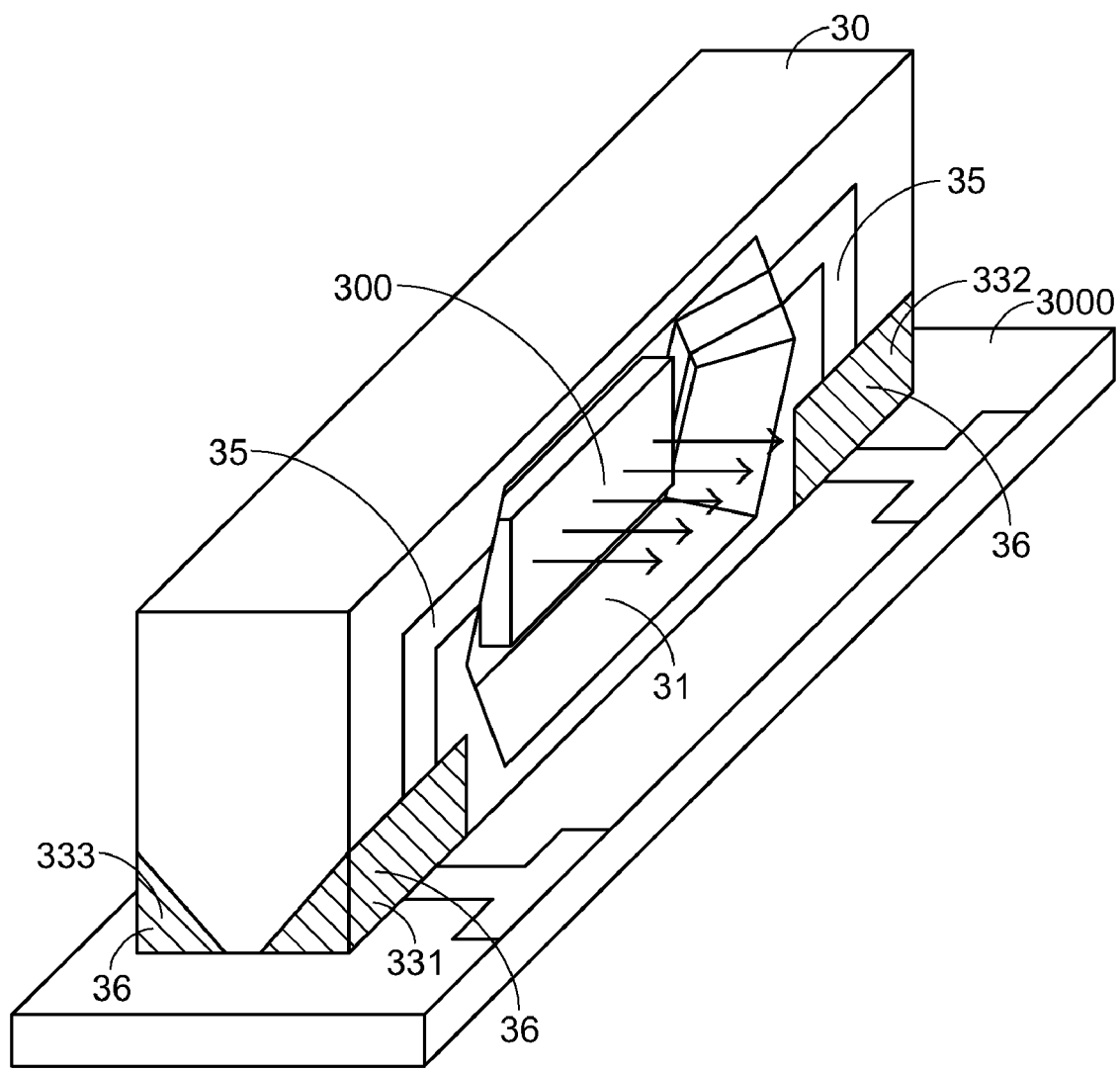
FIG. 3B schematically illustrates the side-view optical diode package of FIG. 3A fixed on a printed circuit board.

FIG. 3A is a schematic perspective view of a side-view optical diode package 3 according to a second preferred embodiment of the present invention is illustrated. In FIG. 3B, the side-view optical diode package 3 is fixed on a printed circuit board 3000. Please refer to FIGS. 3A and 3B. The side-view optical diode package 3 principally includes a silicon substrate 30, a holding space 31, a bonding surface 32, a first positioning structure 33, a second positioning structure 34 and a conducting structure 35. The silicon substrate 30 has a first surface 301 and a second surface 302. The top opening of the holding space 31 is arranged in the first surface 301 of the silicon substrate 30. The bottom of the holding space 31 is used for supporting an optical diode 300 such as an optical diode (LED). The bonding surface 32 is disposed at a lateral side of the silicon substrate 30 and bonded to the printed circuit board 3000. The first positioning structure 33 includes a first indentation 331 and a second indentation 332. The second positioning structure 34 includes a third indentation 333 and a fourth indentation 334. The first indentation 331 is disposed at the junction between a first sidewall 311 of the silicon substrate 30, the first surface 301 of the silicon substrate 30 and the bonding surface 32. The second indentation 332 is disposed at the junction between a second sidewall 312 of the silicon substrate 30, the first surface 301 of the silicon substrate 30 and the bonding surface 32. The third indentation 333 is disposed at the junction between the first sidewall 311 of the silicon substrate 30, the second surface 302 of the silicon substrate 30 and the bonding surface 32. The fourth indentation 334 is disposed at the junction between the second sidewall 312 of the silicon substrate 30, the second surface 302 of the silicon substrate 30 and the bonding surface 32.

Furthermore, the printed circuit board 3000 has solder bumps 36 corresponding to the indentations 331, 332, 333 and 334 of the positioning structures 33 and 34. During the silicon substrate 30 is soldered on the printed circuit board 3000, the solder bumps 36 are molten and filled in these indentations. Likewise, these indentations may prevent the molten solder bumps 36 from overflowing from the periphery of the package. After the molten solder bumps 36 are cooled and solidified, the silicon substrate 30 is bonded onto the printed circuit board 3000 via the solder bumps 36. In comparison with the package 1 of FIG. 1, the package 3 of this embodiment is more stably fixed on the printed circuit board because the positioning structures are formed on lateral sides thereof. The other operation principles are similar to those mentioned above, and are not redundantly described herein.

Hereinafter, a process of fabricating the side-view optical diode package of the second preferred embodiment will be illustrated as follows with reference to FIGS. 4A, 4B, 4C, 4D and 4E.

Figure 4A:
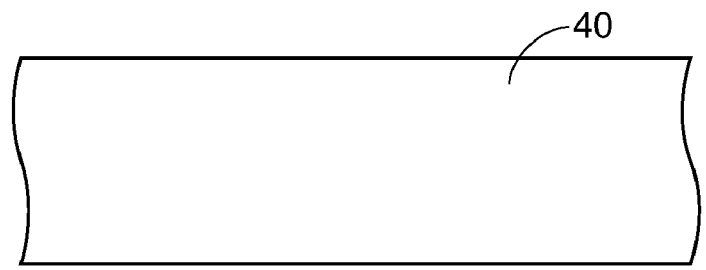
FIGS. 4A, 4B, 4C, 4D and 4E are schematic cross-sectional views illustrating the steps of a process for fabricating the side-view optical diode package of the second preferred embodiment.
Figure 4B:
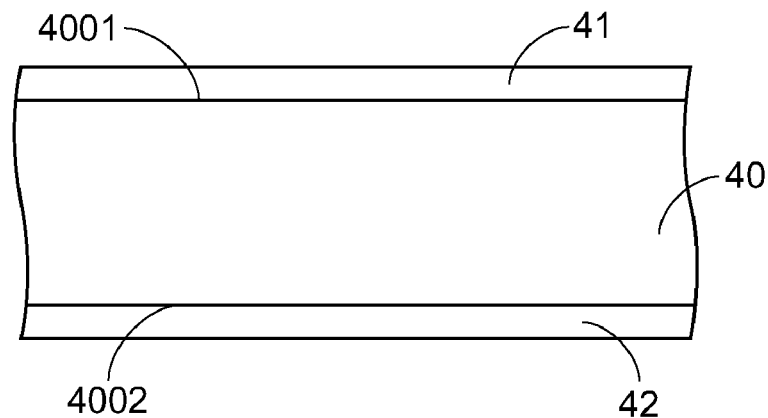
Figure 4C:
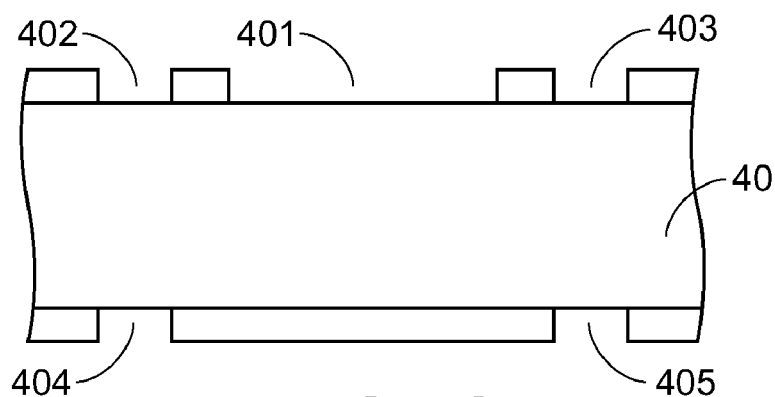
Figure 4D:
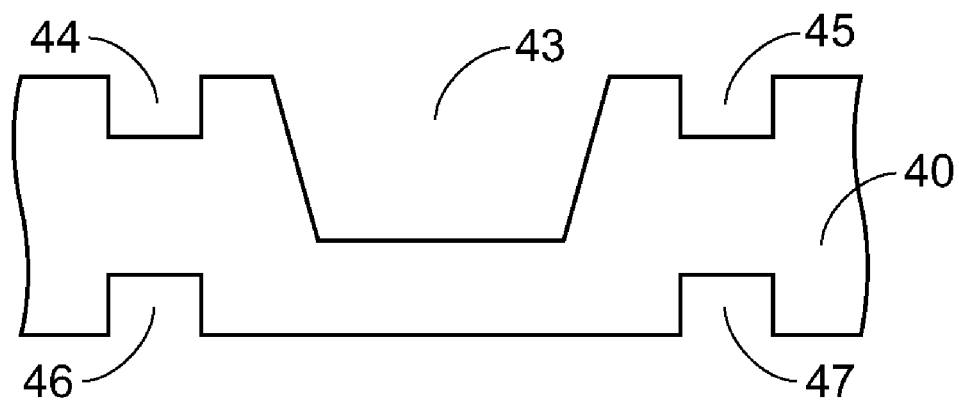
Figure 4E:
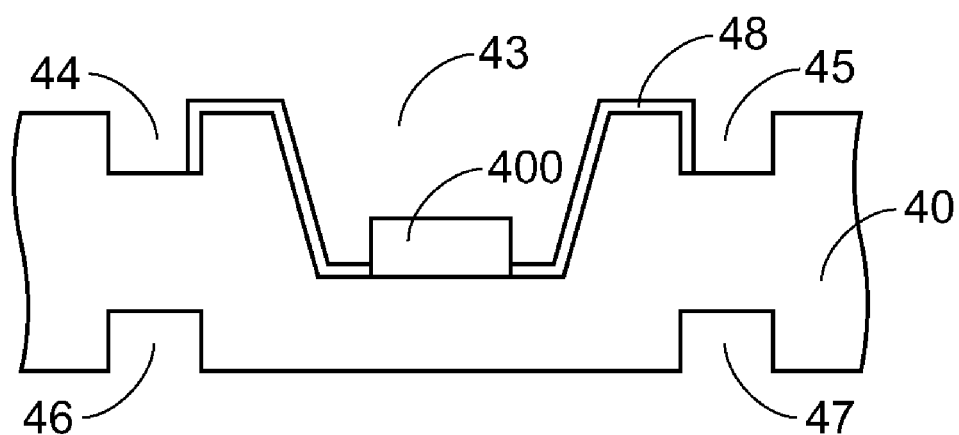
Figure 4F:
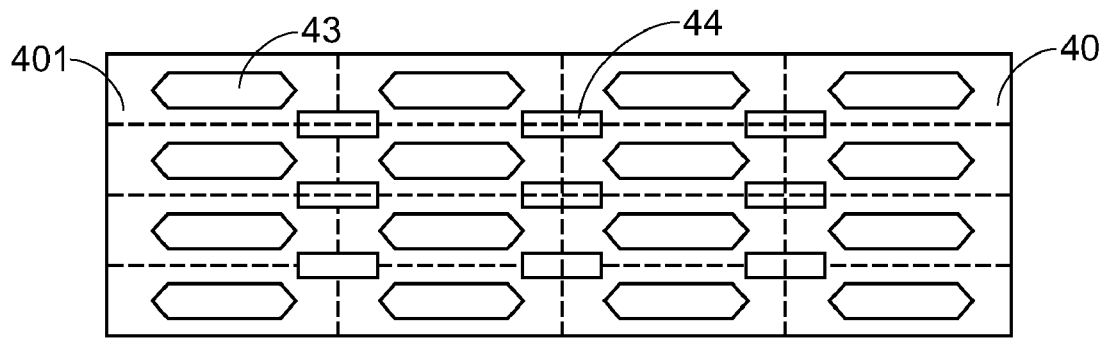
FIGS. 4F and 4I are respectively schematic top and side views illustrating multiple side-view optical diode packages before dicing-cut in a first example.

First of all, as shown in FIG. 4A, a silicon substrate 40 is provided. Then, as shown in FIG. 4B, a first mask layer 41 and a second mask layer 42 are formed on a first surface 4001 and a second surface 4002 of the silicon substrate 40, respectively. Then, as shown in FIG. 3C, the first mask layer 41 is patterned by a first photolithography and etching procedure to define a first opening 401, a second opening 402 and a third opening 403. In addition, the second mask layer 42 is patterned by a second photolithography and etching procedure to define a fourth opening 404 and a fifth opening 405. Next, as shown in FIG. 4D, an etching procedure is performed to partially etch off the silicon substrate 40 in the first opening 401, the second opening 402, the third opening 403, the fourth opening 404 and the fifth opening 405 and then the mask layer 41 is moved, thereby defining a holding space 43 and positioning structures 44, 45, 46, 47, respectively. Then, as shown in FIG. 4E, a conducting material is partially deposited on the first surface 401 of the silicon substrate 40, the bottom surface of the holding space 43, a surface of the positioning structure 44 and a surface of the positioning structure 45, thereby forming a conducting structure 48. Then, an optical diode 400 is mounted on the conducting structure 48 within the holding space 43. After the resulting structure of FIG. 4F is cut along the dashed lines, multiple side-view optical diode packages are formed. It is noted that the sequences of mounting the optical diode 400 and cutting the silicon substrate 40 are exchangeable. That is, the optical diode 400 may be mounted on the conducting structure 48 within the holding space 43 after a resulting package base is cut from the silicon substrate 40. FIG. 4I is a side view of the side-view optical diode package obtained from the resulting structure of FIG. 4F. In this embodiment, the top opening of the positioning structure 43 is substantially rectangular.

Figure 4G:
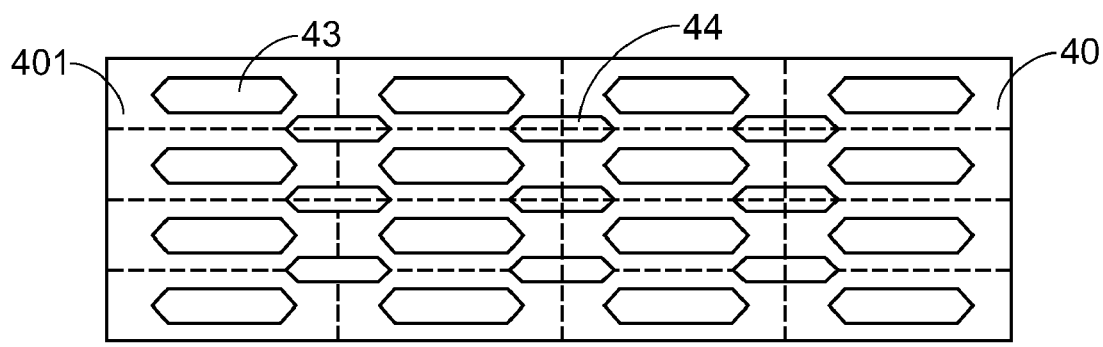
FIGS. 4G and 4J are respectively schematic top and side views illustrating multiple side-view optical diode packages before dicing-cut in a second example.
Figure 4H:
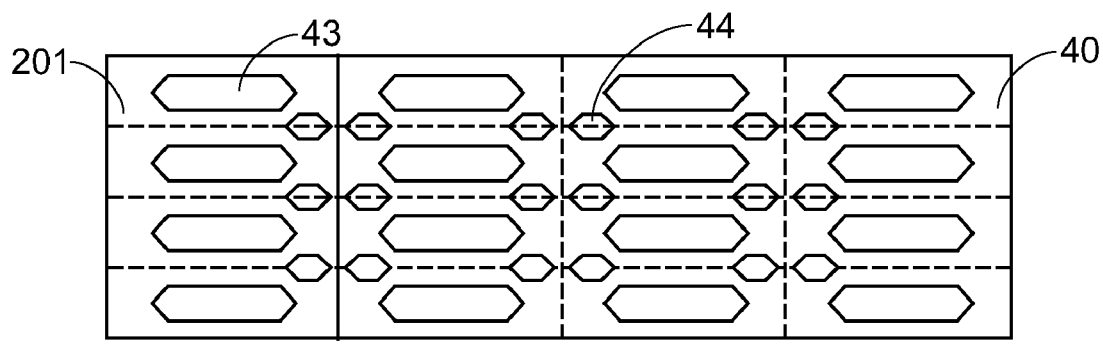
FIGS. 4H and 4K are respectively schematic top and side views illustrating multiple side-view optical diode packages before dicing-cut in a third example.
Figure 4I:
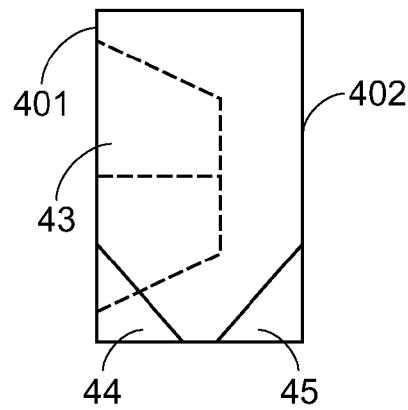
Figure 4J:
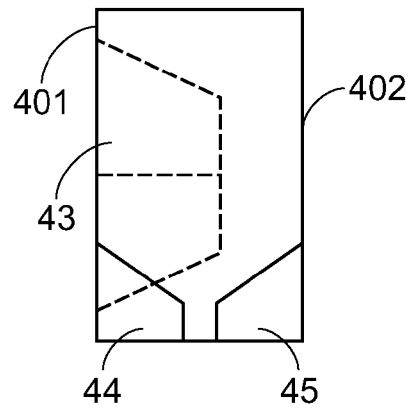
Figure 4K:
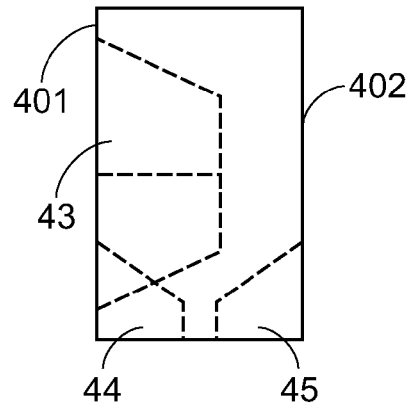

FIG. 4G is a variation of the resulting structure of FIG. 4F. FIG. 4J is a side view of a side-view optical diode package obtained from the resulting structure of FIG. 4G. In this embodiment, the top openings of the positioning structures 44 and 45 are substantially hexagonal. FIG. 4H is another variation of the resulting structure of FIG. 4F. FIG. 4K is a side view of a side-view optical diode package obtained from the resulting structure of FIG. 4H. In this embodiment, the top openings of the positioning structures 44 and/or 45 are substantially a pair of hexagons.

Figure 5A:
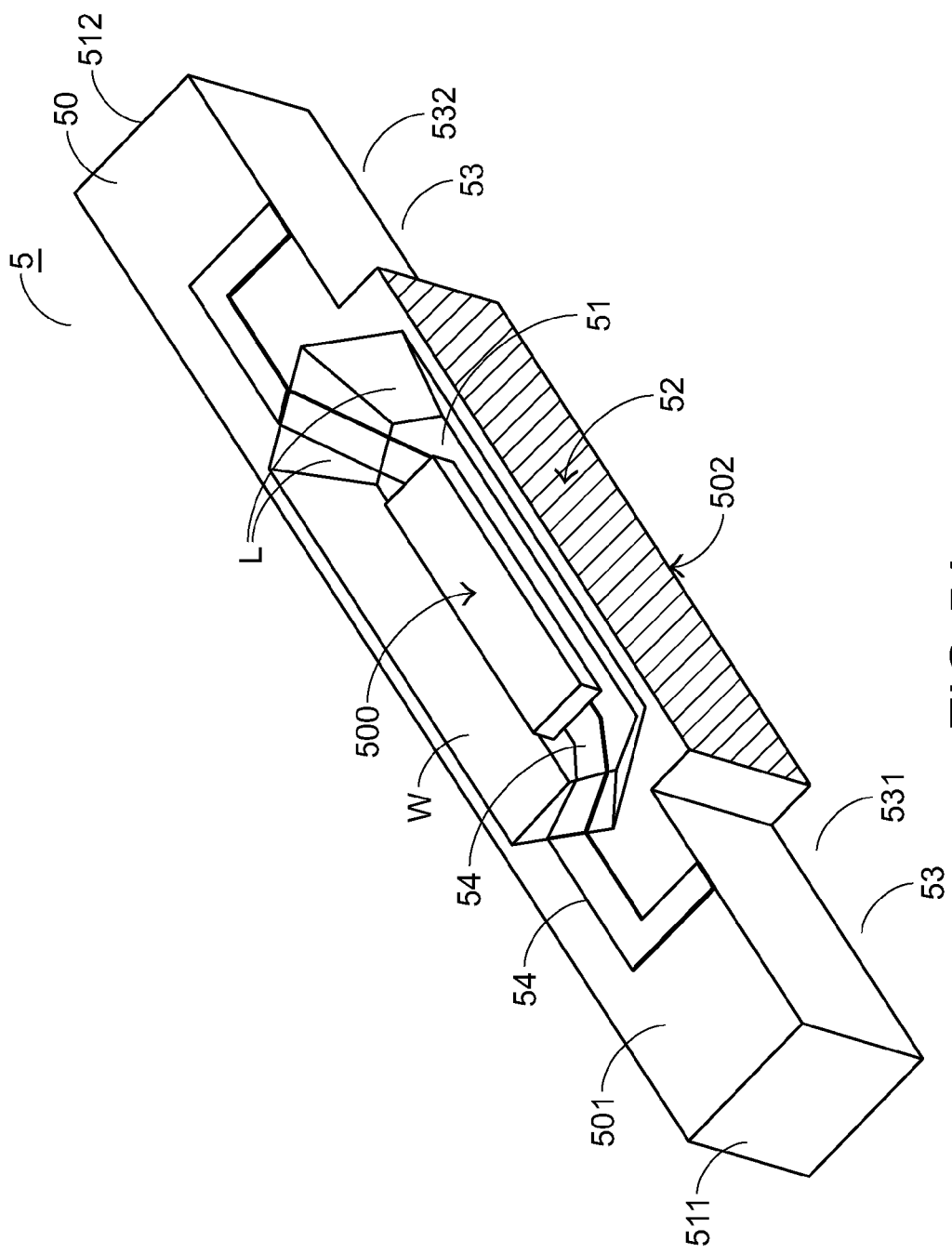
FIG. 5A is a schematic perspective view of a side-view optical diode package according to a third preferred embodiment of the present invention is illustrated.
Figure 5B:
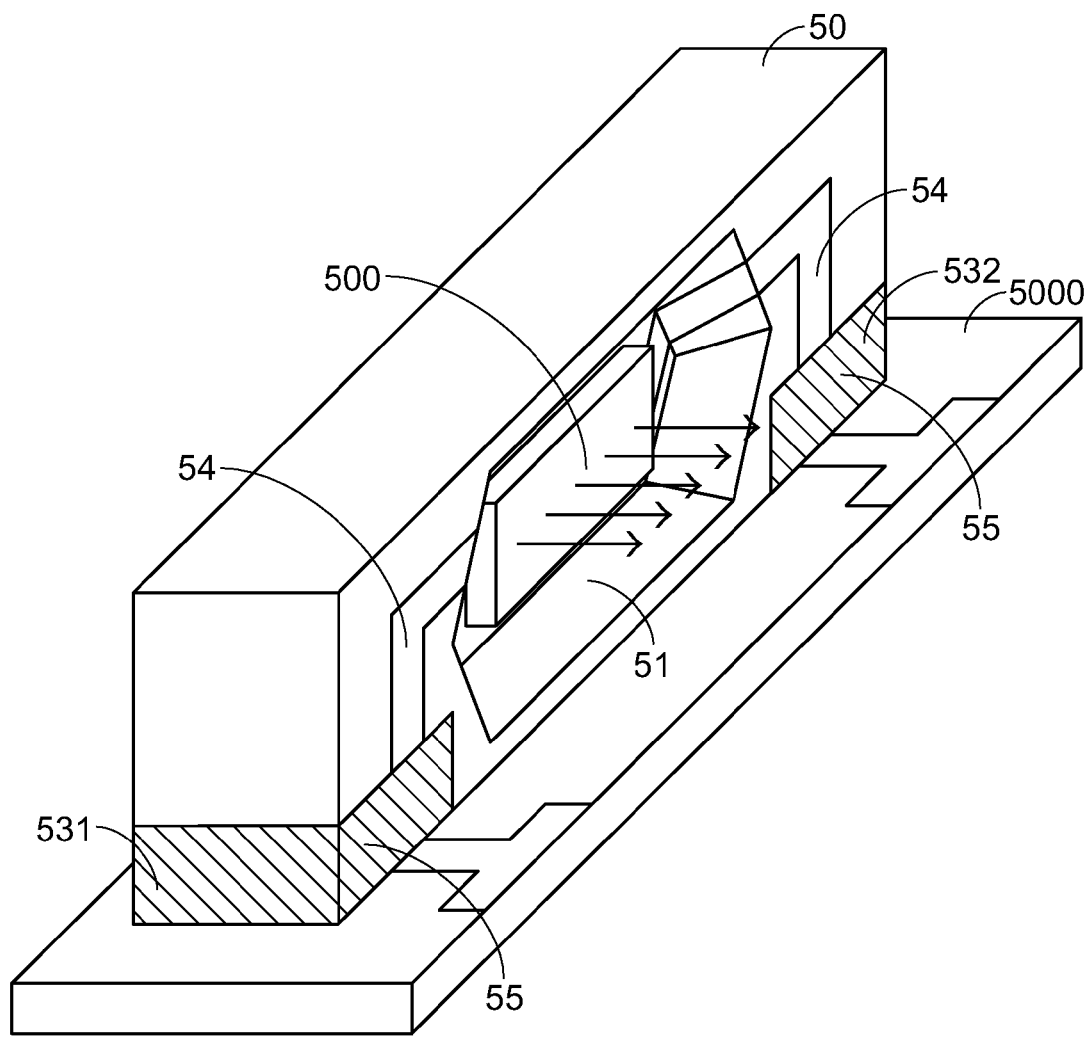
FIG. 5B schematically illustrates the side-view optical diode package of FIG. 5A fixed on a printed circuit board.

FIG. 5A is a schematic perspective view of a side-view optical diode package according to a third preferred embodiment of the present invention is illustrated. In FIG. 5B, the optical diode 500 is fixed on a printed circuit board 5000. Please refer to FIGS. 5A and 5B. The side-view optical diode package 5 principally includes a silicon substrate 50, a holding space 51, a bonding surface 52, a positioning structure 53 and a conducting structure 54. The silicon substrate 50 has a first surface 501 and a second surface 502. The bonding surface 52 is disposed at a lateral side of the silicon substrate 50 and bonded to the printed circuit board 5000. The positioning structure 53 includes a first concave region 531 and a second concave region 532. The first concave region 531 is disposed at the junction between a first sidewall 511 of the silicon substrate 50, the first surface 501 of the silicon substrate 50 and the bonding surface 52. The second concave region 532 is disposed at the junction between a second sidewall 512 of the silicon substrate 50, the first surface 501 of the silicon substrate 50 and the bonding surface 52. Furthermore, the printed circuit board 5000 has solder bumps 55 corresponding to the concave regions 531 and 532. During the silicon substrate 50 is soldered on the printed circuit board 5000, the solder bumps 55 are molten and filled in these concave regions. After the molten solder bumps 55 are cooled and solidified, the silicon substrate 50 is bonded onto the printed circuit board 5000 via the solder bumps 55. The other operation principles and the fabricating process thereof are similar to those mentioned above, and are not redundantly described herein.

The above embodiments are illustrated by referring to single side-view optical diode packages. Nevertheless, the concept of the present invention may be applied to double side-view optical diode packages. Moreover, the concept of the present invention may be extended to mount other optical diodes such as laser diodes.

From the above description, the side-view optical diode package may be securely fixed on the printed circuit board through the positioning structure thereof because the molten solder bumps are received in the indentations or concave regions of the positioning structure without overflowing. Therefore, the problem of causing the leakage current is avoided and the yield of the final product is increased.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A side-view optical diode package, the side-view optical diode package being mounted on a printed circuit board with at least a solder bump, the side-view optical diode package comprising:
    a silicon substrate having a first surface and a second surface;
    a holding space having a top opening in the first surface and a bottom for holding an optical diode thereon;
    a bonding surface disposed at a lateral side of the silicon substrate and bonded onto the printed circuit board;
    a positioning structure having at least a solder-receiving portion beside the bonding surface and corresponding to the solder bump, wherein the solder bump is molten during a soldering process and received in the solder-receiving portion, thereby facilitating positioning the silicon substrate on the printed circuit board, wherein the at least a solder-receiving portion includes:
    a first indentation disposed at the junction between a first sidewall of the silicon substrate, the first surface of the silicon substrate and the bonding surface;
    a second indentation disposed at the junction between a second sidewall of the silicon substrate, the first surface of the silicon substrate and the bonding surface;
    a third indentation disposed at the junction between the first sidewall of the silicon substrate, the second surface of the silicon substrate and the bonding surface; and
    a fourth indentation disposed at the junction between the second sidewall of the silicon substrate, the second surface of the silicon substrate and the bonding surface.

2. The side-view optical diode package according to claim 1 wherein the at least a solder-receiving portion includes:
    a first concave region disposed at the junction between a first sidewall of the silicon substrate, the first surface of the silicon substrate and the bonding surface; and
    a second concave region disposed at the junction between a second sidewall of the silicon substrate, the first surface of the silicon substrate and the bonding surface.

3. The side-view optical diode package according to claim 1 wherein the depth of the holding space is greater than the thickness of the optical diode and the top opening of the holding space is hexagonal or octagonal.

4. The side-view optical diode package according to claim 1 further comprising a conductive structure, which is partially formed on the bottom of the holding space, the first surface of the silicon substrate and the surface of the positioning structure.

5. The side-view optical diode package according to claim 1 wherein the solder-receiving portion of the positioning structure further has an inclined sidewall.

6. The side-view optical diode package according to claim 5 wherein the silicon substrate is a high resistivity silicon substrate with (100)-oriented lattice, and the inclined sidewall has a more than 80-degree (100) equivalent crystallographic surface.

7. The side-view optical diode package according to claim 6 wherein the holding space includes:
    a first slant having a 54.74-degree (111) equivalent crystallographic surface; and
    a second slant having a more than 80-degree (100) equivalent crystallographic surface.

8. The side-view optical diode package according to claim 5 wherein the silicon substrate is a high resistivity silicon substrate with (110)-oriented lattice, and the inclined sidewall has a more than 80-degree (111) equivalent crystallographic surface.

9. The side-view optical diode package according to claim 8 wherein the holding space includes:
   a first slant having a 35.3-degree (111) equivalent crystallographic surface; and
   a second slant having a more than 80-degree (111) equivalent crystallographic surface.

10. The side-view optical diode package according to claim 1 wherein the side-view optical diode package is a single side-view optical diode package or a double side-view optical diode package.

* * * * *